(12) United States Patent
Yun et al.

(10) Patent No.: US 10,257,451 B2
(45) Date of Patent: Apr. 9, 2019

(54) COMPARISON DEVICE AND CMOS IMAGE SENSOR USING THE SAME

(71) Applicant: SK hynix Inc., Gyeonggi-do (KR)

(72) Inventors: Gun-Hee Yun, Gyeonggi-do (KR); Hyun-Mook Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 27 days.

(21) Appl. No.: 15/293,439

(22) Filed: Oct. 14, 2016

(65) Prior Publication Data

US 2017/0280077 A1    Sep. 28, 2017

(30) Foreign Application Priority Data

Mar. 28, 2016  (KR) .................. 10-2016-0036954

(51) Int. Cl.
| | | |
|---|---|---|
| H04N 5/357 | (2011.01) | |
| H04N 5/378 | (2011.01) | |
| H01L 27/146 | (2006.01) | |
| H04N 5/3745 | (2011.01) | |

(52) U.S. Cl.
CPC ..... *H04N 5/3575* (2013.01); *H01L 27/14609* (2013.01); *H01L 27/14643* (2013.01); *H04N 5/378* (2013.01); *H04N 5/3745* (2013.01)

(58) Field of Classification Search
CPC .... H04N 5/3575; H04N 5/378; H04N 5/3745; H01L 27/14609; H01L 27/14643
See application file for complete search history.

(56) References Cited

U.S. PATENT DOCUMENTS

| | | | |
|---|---|---|---|
| 8,743,258 B2* | 6/2014 | Park ................... | G01J 1/46 348/294 |
| 2006/0164277 A1* | 7/2006 | Lee ..................... | G06J 1/00 341/155 |
| 2008/0094494 A1* | 4/2008 | Lee ..................... | H04N 5/3575 348/294 |
| 2012/0049042 A1* | 3/2012 | Lim .................... | H04N 5/3575 250/208.1 |
| 2012/0307120 A1* | 12/2012 | Ito ...................... | H04N 5/341 348/302 |
| 2013/0026343 A1* | 1/2013 | Saito .................. | H04N 5/335 250/208.1 |
| 2016/0336949 A1* | 11/2016 | Milkov ............... | H03M 1/1245 |

FOREIGN PATENT DOCUMENTS

| | | |
|---|---|---|
| KR | 1020140033604 | 3/2014 |
| KR | 101452406 | 10/2014 |

* cited by examiner

*Primary Examiner* — Lin Ye
*Assistant Examiner* — John H. Morehead, III
(74) *Attorney, Agent, or Firm* — IP & T Group LLP

(57) ABSTRACT

Provided are a comparison device capable of achieving a small area by using one small sampling capacitor for an input terminal and improving linearity by using a fixed reference voltage and a CMOS image sensor using the same. The comparison device may include a comparator configured to compare a pixel signal inputted through a positive input terminal with a ramp signal, a first sampling capacitor configured to be provided between an input terminal of the ramp signal and the positive input terminal of the comparator, a sampling switch configured to be provided between an output terminal of the comparator and a negative input terminal of the comparator, and a second sampling capacitor configured to be provided between a ground terminal and the negative input terminal of the comparator.

9 Claims, 5 Drawing Sheets

COMPARISON DEVICE AND CMOS IMAGE SENSOR USING THE SAME

CROSS-REFERENCE TO RELATED APPLICATIONS

The present application claims priority under 35 U.S.C. 119(a) to Korean Patent Application No. 10-2016-0036954, filed on Mar. 28, 2016, which is incorporated herein by reference in its entirety.

BACKGROUND

1. Field

Exemplary embodiments relate generally to a complementary metal-oxide-semiconductor (CMOS) image sensor (CIS) and, more particularly, to a comparison device using a small sampling capacitor for an input terminal and using a fixed reference voltage and a CMOS image sensor using the same.

Next, in terms used in the following description of embodiments, an input common mode voltage indicates an input common mode voltage of a first comparator that performs a "correlated double sampling (CDS)" operation.

2. Description of the Related Art

In general, in a CMOS image sensor (CIS) using a column-parallel analog-to-digital (ADC) structure, the size of a sampling capacitor positioned at an input terminal of a comparison unit occupies a large part of the entire sensor area.

The characteristics of a correlated double sampling (CDS) operation performed in the comparison unit of the CMOS image sensor may vary significantly depending upon an input common mode voltage, resulting in the degradation of the image quality of the CMOS image sensor.

For example, since a "comparator with single-ended AC-coupled input" uses one input sampling capacitor, it may be implemented to have a small area, but when a swing voltage of a ramp signal is changed according to an analog gain, the input common mode voltage is changed. Such a change in the input common mode voltage serves as a noise source and reduces the linearity of the CMOS image sensor.

In another example, since a "comparator with differential AC-coupled input" operates with a feedback structure, it captures the input common mode voltage by itself. In this case, ramp noise may be reduced by a sampling capacitor to which a ramp signal is inputted, but an area increases because two input sampling capacitors are used.

SUMMARY

Various embodiments of the present invention are directed to a comparison device for a CIS that is capable of achieving a small area by using one small sampling capacitor for an input terminal and improving linearity by using a fixed reference voltage and a complementary metal-oxide-semiconductor (CMOS) image sensor using the same.

In an embodiment, a comparison device may include a comparator configured to compare a pixel signal inputted through a positive input terminal with a ramp signal; a first sampling capacitor configured to be provided between an input terminal of the ramp signal and the positive input terminal of the comparator; a sampling switch configured to be provided between an output terminal of the comparator and a negative input terminal of the comparator; and a second sampling capacitor configured to be provided between a ground terminal and the negative input terminal of the comparator.

In an embodiment, a CMOS image sensor may include a pixel array configured to output a pixel signal corresponding to incident light; a row decoder configured to select a pixel in the pixel array according to row lines under control of a control unit; a ramp signal generation device configured to generate a ramp signal under the control of the control unit; a comparison unit configured to sample a reset signal from the pixel array to capture an input common mode voltage, store an offset between a reverence voltage of the ramp signal from the ramp signal generation device and a reset signal, and determine the reset signal and a signal based on the input common mode voltage according to the ramp signal; a counting unit configured to count a clock from the control unit according to each output signal from the comparison unit; a memory unit configured to store counting information from the counting unit under the control of the control unit; the control unit configured to control operations of the row decoder, the ramp signal generation device, the counting unit, the memory unit, and a column readout circuit; and the column readout circuit configured to output data of the memory unit under the control of the control unit.

In accordance with the present embodiment, a fixed reference voltage is used, so that it is possible to improve the linearity of a CMOS image sensor.

Furthermore, in accordance with the present embodiment, one small sampling capacitor is used for an input terminal of a comparison device, so that it is possible to achieve a CMOS image sensor having a small area.

Furthermore, in accordance with the present embodiment, a sampling capacitor is provided to receive a ramp signal, so that it is possible to improve a signal-to-noise ratio (SNR) for pixel input and it is possible to reduce ramp noise as well as kickback.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
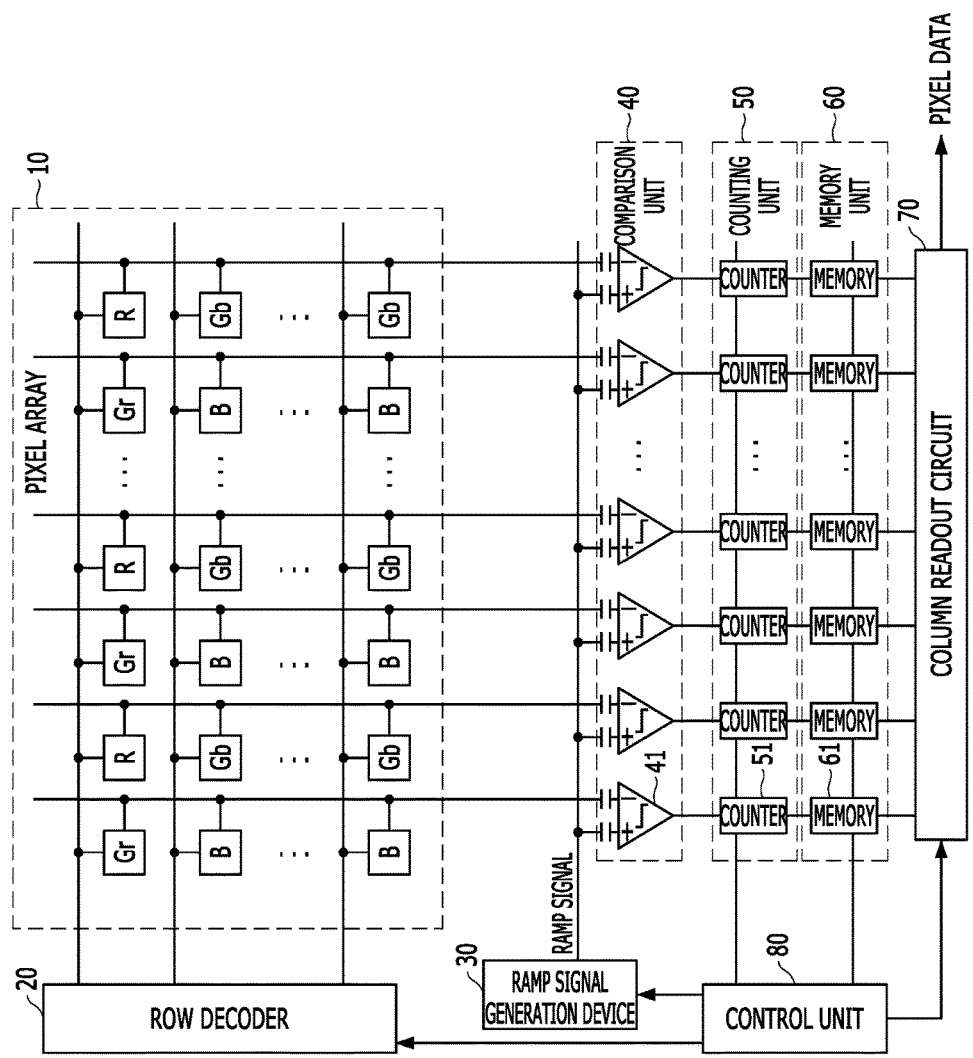
FIG. 1 is a diagram illustrating a structure of a complementary metal-oxide-semiconductor (CMOS) image sensor.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

FIG. 1 is a diagram illustrating a structure of a CMOS image sensor (CIS) using a general column-parallel structure.

Referring to FIG. 1, the CMOS image sensor (CIS) includes a pixel array 10 for outputting a pixel signal corresponding to incident light, a row decoder 20, a ramp signal generation device 30, a comparison unit 40, a counting unit 50, a memory unit 60, a column readout circuit 70, and a control unit 80. The row decoder 20 selects pixels in the pixel array 10 according to row lines under the control of the control unit 80 (for example, a timing generator) and controls the operations of the selected pixels. The ramp signal generation device 30 generates a ramp signal under the control of the control unit 80. The comparison unit 40 compares values of each pixel signal outputted from the pixel array 10 with a value of the ramp signal applied from the ramp signal generation device 30. The counting unit 50 counts clocks from the control unit 80 according to each output signal from the comparison unit 40. The memory unit 60 stores counting information from the counting unit 50 under the control of the control unit 80. The column readout circuit 70 sequentially outputs data of the memory unit 60 as pixel data PXDATA under the control of the control unit 80. The control unit 80 controls the operations of the row decoder 20, the ramp signal generation device 30, the counting unit 50, the memory unit 60, and the column readout circuit 70.

In general, the CMOS image sensor compares pixel signals (i.e., pixel output voltages) before and after an optical signal is incident with each other in order to remove offset values of pixels and actually measure only a pixel signal by incident light. This scheme is called correlated double sampling (CDS).

The comparison unit 40 includes a plurality of comparators, the counting unit 50 includes a plurality of counters, and the memory unit 60 includes a plurality of memories which are arranged in columns so that each column has one comparator, one counter, and one memory coupled in series.

Hereinafter, an operation, such as an analog-to-digital conversion operation employing one comparator, one counter, and one memory will be described as an example.

Accordingly, in operation, a first comparator 41 of the comparison unit 40 receives a pixel signal, which is outputted from a first column of the pixel array 10, through one terminal thereof, and receives a ramp signal VRAMP, which is applied from the ramp signal generation device 30, through the other terminal thereof. Then, the comparator 41 compares values of the two signals with each other, and outputs a comparison signal.

The voltage level of the ramp signal VRAMP is gradually reduced (or is gradually increased) according to the passage of time, resulting in the occurrence of a time point at which values of the two signals inputted to the first comparator coincide with each other. Immediately after the time point at which the ramp signal and the pixel signal coincide, the value of the comparison signal outputted from the first comparator is inverted. The same operation is performed by each of the plurality of comparators in the comparison unit for the pixel signals received from each column of the pixel array.

Then, returning to the description of the operation of the first column of the CIS of FIG. 1, a first counter 51 of the counting unit 50 counts a clock from the control unit 80 from the time point at which the ramp signal VRAMP is reduced (or is increased) to the time point at which the comparison signal is outputted from the comparator 41, and outputs the counting information. The same operation is performed by each of the plurality of counters in the counting unit for the comparison signals received from each column comparator. Respective counters are initialized according to a reset signal from the control unit 80.

Then, a first memory 61 of the memory unit 60 stores the counting information from the counter 51 according to a load signal from the control unit 80, and outputs the counting information to the column readout circuit 70.

Figure 2A:
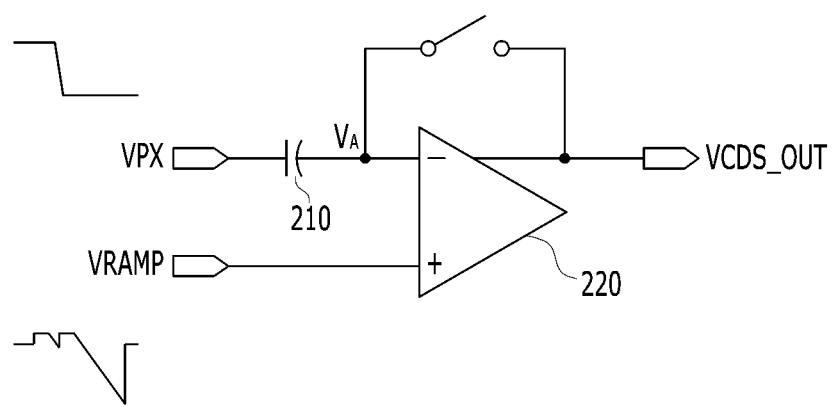
FIGS. 2A and 2B are diagrams illustrating examples of a comparator included in a complementary metal-oxide-semiconductor (CMOS) image sensor.
Figure 2B:
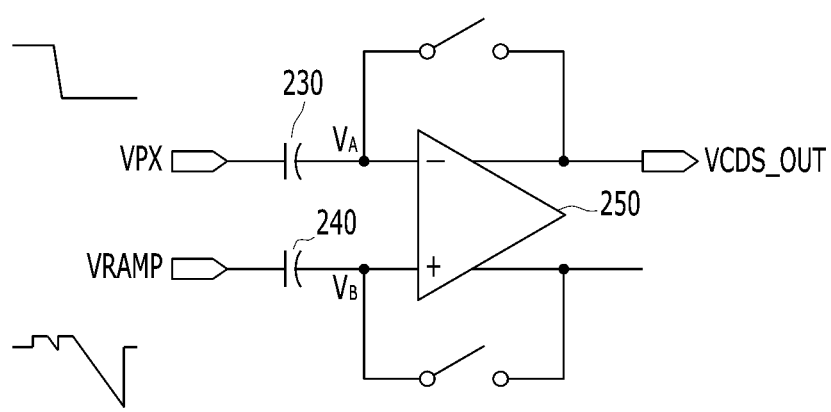
Figure 2C:
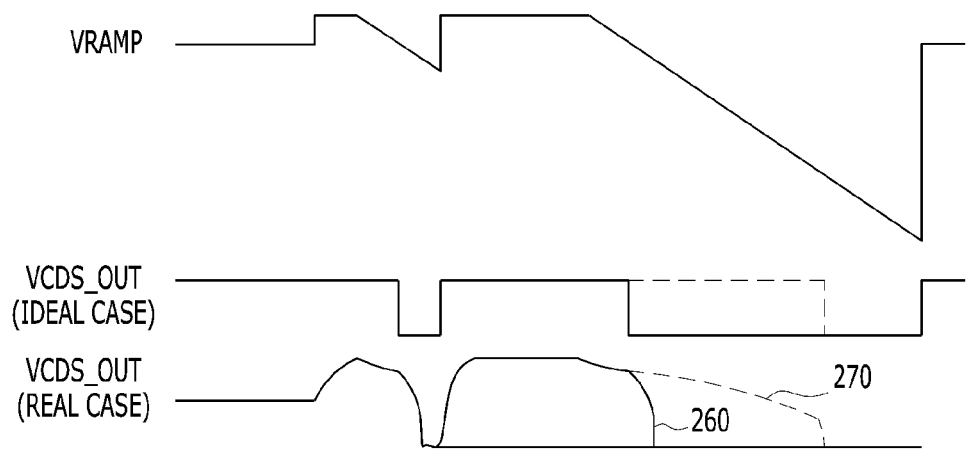
FIG. 2C is a timing diagram illustrating operations of the comparators shown in FIGS. 2A and 2B.

FIGS. 2A and 2B illustrate examples of a comparator included in a complementary metal-oxide-semiconductor (CMOS) image sensor. FIG. 2C is a timing diagram illustrating operations of comparators shown in FIGS. 2A and 2B.

FIG. 2A illustrates the case in which a comparator positioned at each column is a comparator with single-ended AC-coupled input. FIG. 2B illustrates the case in which a comparator positioned at each column is a comparator with differential AC-coupled input. FIG. 2C illustrates a waveform change according to a correlated double sampling operation in the comparators illustrated in FIG. 2A and FIG. 2B.

As illustrated in FIG. 2A, when the comparator is a comparator with single-ended AC-coupled input, only one input sampling capacitor 210 is used, hence, the comparator and also a CIS employing such comparator may be implemented to have a smaller area than the differential AC-coupled input comparator of FIG. 2. However, an input voltage of an input node $V_A$ of the comparator 220 as a first stage comparator in the comparison unit 40 of FIG. 1 is changed to an input common mode voltage which is changed based on the ramp signal VRAMP changed according to an analog gain.

In the case of the comparator 220 illustrated in FIG. 2A, a swing voltage of the ramp signal VRAMP is changed according to an analog gain, resulting in a change in an input common mode voltage applied to the input node $V_A$ of the comparator 220. Such a change in the input common mode voltage serves as a noise source and reduces the linearity of the CMOS image sensor.

As illustrated in FIG. 2B, when the comparator 250 is a comparator with differential AC-coupled input, an input voltage of an input node $V_A$ of a comparator 250 as a first stage comparator in the comparison unit 40 of FIG. 1 is substantially maintained to be substantially equal to an input common mode voltage of correlated double sampling itself. That is, since the comparator 250 operates with a feedback structure by a feedback switch in a reset operation, it captures the input common mode voltage by itself.

In the case of the comparator 250 illustrated in FIG. 2B, ramp noise may be reduced by a sampling capacitor 240 to which a ramp signal VRAMP is inputted, but an area increases because two input sampling capacitors 230 and 240 are used.

Hereinafter, a waveform change according to the correlated double sampling (CDS) operation in the comparators illustrated in FIG. 2A and FIG. 2B will be described with reference to FIG. 2C. Since the correlated double sampling input of the comparators includes a fixed pixel signal VPX and a ramp signal VRAMP changed during an analog-to-digital conversion period, an output common mode voltage VCDS_OUT (that is, an output common mode voltage of the comparator that performs the correlated double sampling operation) is gradually reduced according to the falling of the ramp signal VRAMP. As illustrated in VCDS_OUT (a real case) of FIG. 2C, the correlated double sampling output (that is, the comparator output signal) is changed while the output common mode voltage VCDS_OUT is being reduced as illustrated in the waveform 260 in a dark state and the waveform 270 in a white state.

In the dark state with no light, since the input common mode voltage and the output common mode voltage VCDS_OUT are respectively constant all the time when the comparator of the correlated double sampling circuit determines a reset signal and a signal of pixels, there is no meaningful difference. However, in the white state in which the signal is inputted, since there is a large difference between a voltage level of the ramp signal $V_{RAMP}$ when determining the reset signal and a voltage level of the ramp signal $V_{RAMP}$ when determining the signal, it is difficult to regard that the reset signal and the signal are determined in substantially the same conditions.

In this regard, in the present embodiment, one small sampling capacitor is used for an input terminal so as to achieve a CMOS image sensor having a small area and the linearity of the CMOS image sensor is improved using a fixed reference voltage. This will be described in detail with reference to FIG. 3A to FIG. 3C as follows.

Figure 3A:
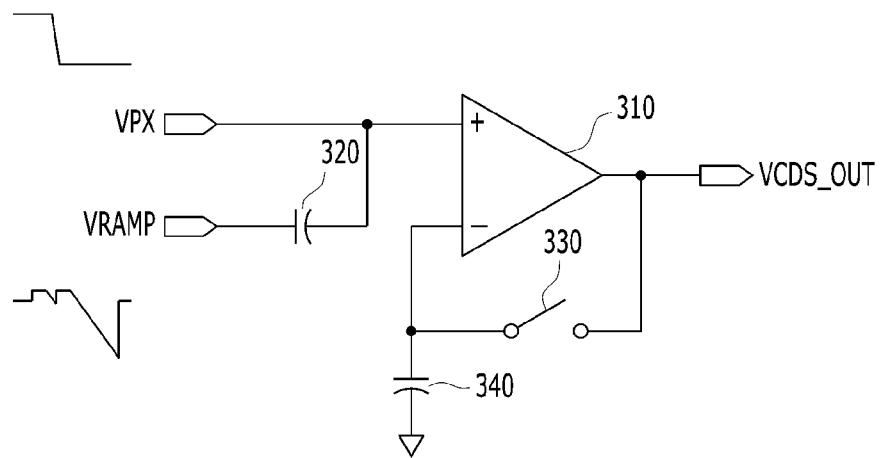
FIG. 3A and FIG. 3B are diagrams illustrating a configuration of a comparison device included in a complementary metal-oxide-semiconductor (CMOS) image sensor in accordance with an embodiment of the present invention.
Figure 3B:
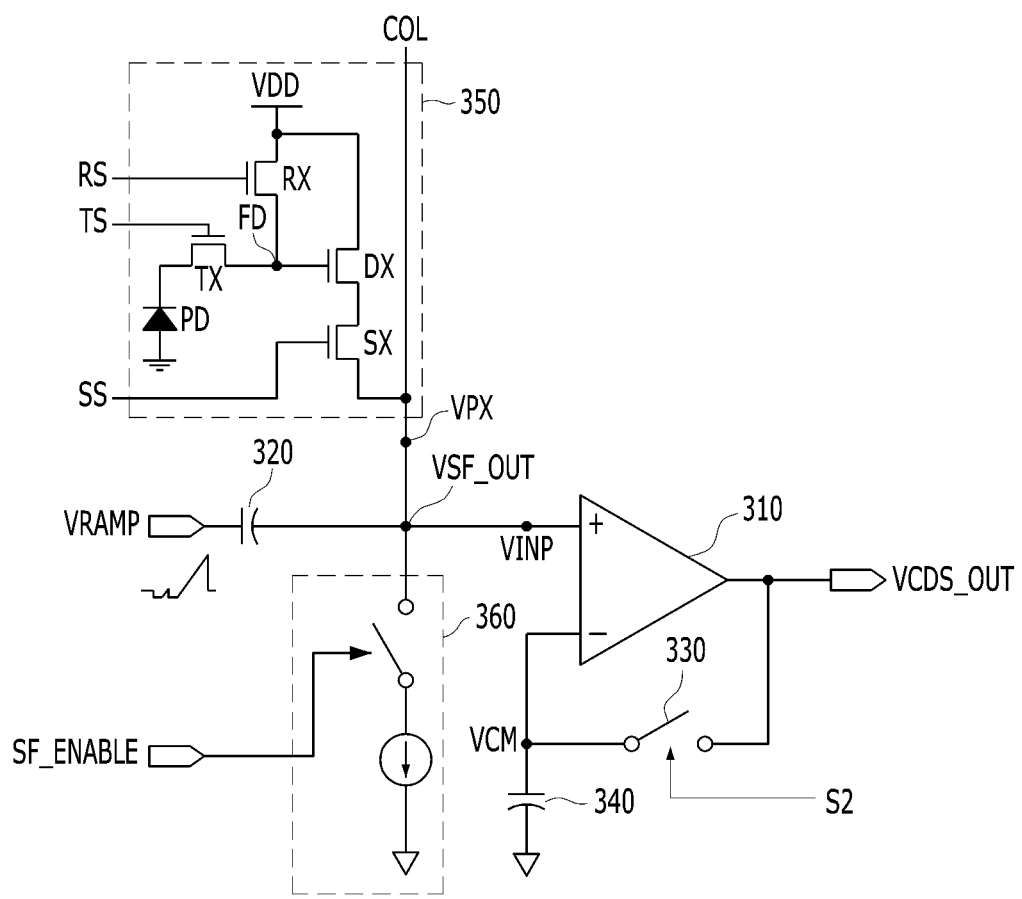
Figure 3C:
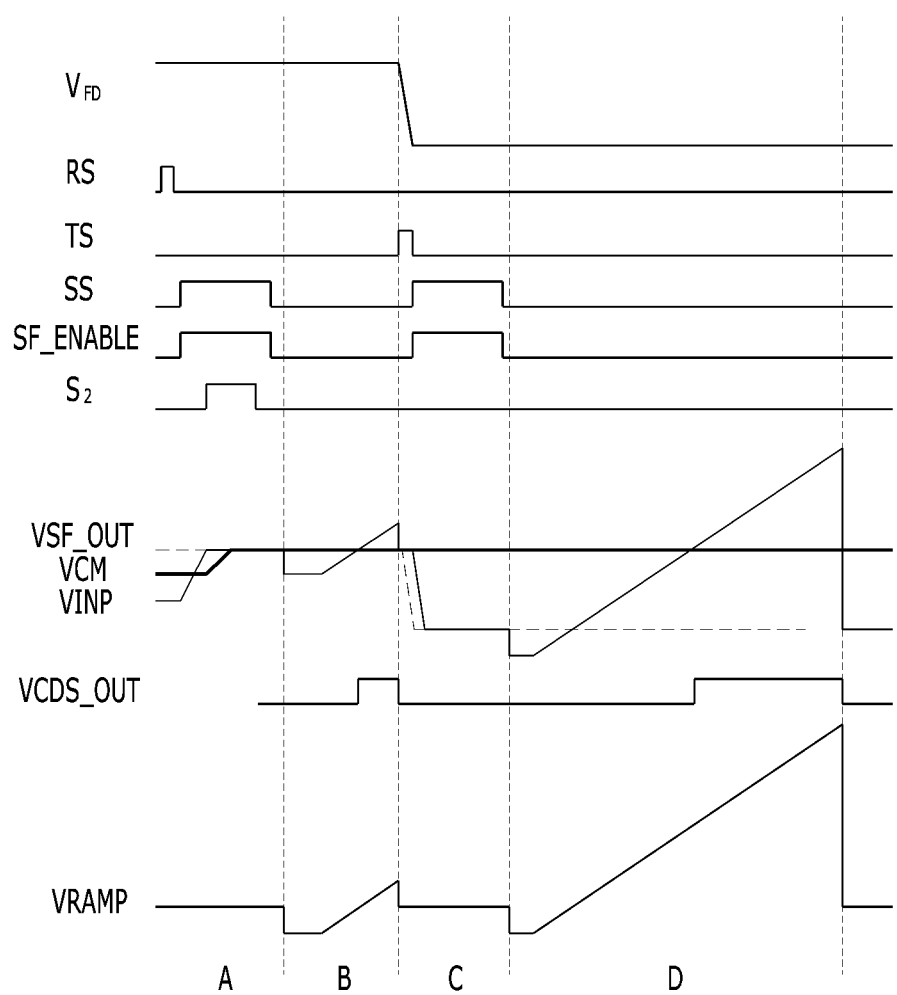
FIG. 3C is a timing diagram illustrating an operation of a comparison device in accordance with an embodiment of the present invention.

FIG. 3A to FIG. 3B are diagrams illustrating a configuration of a comparison device included in a complementary metal-oxide-semiconductor (CMOS) image sensor in accordance with an embodiment of the present invention. FIG. 3C is a timing diagram illustrating an operation of a comparison device in accordance with an embodiment.

The comparison device illustrated in FIG. 3A may be applied to the comparator 41 positioned at each column of FIG. 1. FIG. 3B illustrates a comparison device coupled to a well-known unit pixel 350 and a bias circuit 360 included in a source follower coupled to the comparison device. FIG. 3C illustrates a waveform change according to a correlated double sampling (CDS) operation in the comparison devices illustrated in FIG. 3A and FIG. 3B.

Referring to FIG. 3A, the comparison device may include a comparator 310, a first sampling capacitor 320, a sampling switch 330 and a second sampling capacitor 340. The comparator 310 compares a pixel signal VPX inputted through a positive (or non-inversion) input terminal (+) with a ramp signal VRAMP. The first sampling capacitor 320 is provided between an input terminal of the ramp signal VRAMP and the positive input terminal (+) of the comparator 310. The sampling switch 330 is provided between an output terminal of the comparator 310 and a negative (or inversion) input terminal (−) of the comparator 310. The second sampling capacitor 340 is provided between a ground terminal and the negative input terminal (−) of the comparator 310. The pixel signal VPX includes a reset signal (i.e., a reset voltage) and an image data signal.

The comparison device sets an input common mode voltage VCM to a specific voltage level by using a reset voltage of the pixel signal VPX. That is, the comparison device samples the reset signal (i.e., a reset voltage) inputted to the positive input terminal (+) of the comparator 310 from the pixel (350 of FIG. 3B) and sets the input common mode voltage VCM to the specific voltage level.

The sampling switch 330 and the second sampling capacitor 340 sample the reset signal (i.e., the reset voltage) of the pixel signal VPX to set the input common mode voltage VCM, and the second sampling capacitor 340 stores the input common mode voltage VCM.

The first sampling capacitor 320 stores an offset between a reference voltage of the ramp signal VRAMP and the reset signal (i.e., the reset voltage) of the pixel signal VPX from the unit pixel 350. The reference voltage is a voltage before ramping of the ramp signal VRAMP starts.

Next, the operation of the comparison device will be described with reference to FIG. 3B and FIG. 3C.

Referring to FIG. 3B, a unit pixel 350 may include a photodiode PD, a transfer transistor TX, a floating diffusion node FD, a reset transistor RX, a drive transistor DX, and a select transistor SX. The photodiode PD may be any suitable photoelectric conversion element. For example, the photodiode may include at least one among a photo transistor, a photo gate, a pinned photodiode (PPD), and a combination thereof. FIG. 3B shows a 4-transistor (4T) structure that includes a single photodiode PD and four metal oxide semiconductor (MOS) transistors TX, RX, DX, and SX, but the inventive concepts are not restricted to this example. Any suitable unit pixel circuit may be used without departing from the scope of the present invention. For example, a unit pixel circuit including three transistors including the drive transistor DX and the select transistor SX and the photodiode PD may also be used in the implementation of the present invention. In operation, the photodiode PD of the unit pixel 350 generates a photocharge varying with the intensity of light reflected from an object. The transfer transistor TX transfers the photocharge to the floating diffusion node FD in response to a transfer control signal TS received from the row decoder 20 of FIG. 1. The drive transistor DX may then transmit the photocharge to the select transistor SX according to the photocharge accumulated at the floating diffusion node FD. The select transistor SX has a drain node connected to a source node of the drive transistor DX. The select transistor SX may output a pixel signal VPX to a column line connected to the unit pixel 350 in response to a select signal SS received from the row decoder 20. The reset transistor RX may reset the floating diffusion node FD to a power supply voltage VDD in response to a reset signal RS received from the row decoder 20. The drive transistor DX is enabled in response to a voltage level VFD of the floating diffusion node FD. The source follower includes the bias circuit 360, the drive transistor DX and the select transistor SX included in the unit pixel 350. An output voltage VSF_OUT of the source follower is the same as the voltage of the pixel signal VPX.

In a first section A, after the reset operation of the unit pixel 350 and before ramping of the ramp signal VRAMP starts, when the source follower is operating in response to an activated source follower enable signal SF_ENABLE, if a switch control signal S2 from an external control unit is enabled and the sampling switch 330 is turned on, the reset signal (i.e., a reset voltage) from the unit pixel 350 is inputted to the comparator 310 through a positive input node VINP, is outputted to an output terminal, is sampled through the sampling switch 330 and the second sampling capacitor 340, and is stored in the second sampling capacitor 340 as an input common mode voltage VCM. Accordingly, the reset voltage (i.e., the reset signal) is applied to the positive input terminal and the negative input terminal of the comparator 310. Consequently, it is possible to use a fixed reference voltage as the input common mode voltage VCM, resulting in the improvement of the linearity of a CMOS image sensor.

As described above, in the first section A, when the sampling switch 330 and the second sampling capacitor 340 sample the reset voltage according to the switch control signal S2 to set the input common mode voltage VCM, the reset signal outputted from the unit pixel 350 and the offset of the comparator 310 are stored in the second sampling capacitor 340 coupled to a common mode node according to the operation of the source follower and an offset (i.e., a difference value) between the reference voltage of the ramp signal VRAMP and the reset signal (i.e., the reset voltage) from the unit pixel 350 is stored in the first sampling capacitor 320. At this time, the offset voltage value is sampled by the first sampling capacitor 320.

Then, When the switch control signal S2 from the external control unit is disabled to turn off the sampling switch 330, and the source follower of the unit pixel 350 is disabled in response to the deactivated source follower enable signal SF_ENABLE to float the positive input node VINP, when the ramp signal VRAMP is ramped, the input voltage of the comparator 310 moves based on the reset signal from the unit pixel 350 according to the ramp signal VRAMP in a second section B. The second section B is a section while the ramp signal VRAMP starts ramping in short.

Accordingly, the reset signal from the unit pixel 350 is determined by a short ramp swing based on the previously sampled input common mode voltage VCM. The ramping direction may be a falling direction or a rising direction. The circuit in accordance with the embodiment shows an example realized in the rising direction, however, it may also be readily realized in the falling direction through a slight circuit modification.

Then, when the transmission transistor TX is turned on to change a voltage of the floating diffusion node FD to a signal voltage of the unit pixel 350, when the source follower of the unit pixel 350 is operated again, a signal is outputted to the comparator 310 from the unit pixel 350. At this time, the input voltage of the positive input node VINP of the comparator 310 falls according to the signal in a third section C. The third section C is a section before ramping of the ramp signal VRAMP restarts.

Then, in a fourth section D, after the source follower of the unit pixel 350 is disabled to float the positive input node VINP, when the ramp signal VRAMP is ramped, the input voltage of the comparator 310 moves based on the signal from the unit pixel 350 according to the ramp signal VRAMP in the fourth section D. The fourth section D is a section while the ramp signal VRAMP restarts ramping lengthy.

Accordingly, the signal from the unit pixel 350 is determined by a ramp swing based on the previously sampled input common mode voltage VCM. In this case, an input voltage rises again in the state in which the input voltage has been reduced by the signal voltage from the unit pixel 350, and a determination operation is performed at the time point at which the input voltage is substantially equal to the previously sampled input common mode voltage VCM.

As described above, a comparison device, in accordance with an embodiment of the present invention, performs CDS with a correlated double sampling output which moves according to a ramp signal. However, unlike existing devices, the comparison device holds an input common mode voltage VCM constant at the time point at which the comparison device determines a signal, thus determining a reset signal and a pixel signal in substantially the same conditions.

Although various embodiments have been described for illustrative purposes, it will be apparent to those skilled in the art that various changes and modifications may be made without departing from the spirit and scope of the invention as defined in the following claims.

What is claimed is:
1. A comparison device comprising:
a comparator having a first and a second input terminal, the comparator being suitable for comparing a pixel signal including a reset signal and an image data signal with a ramp signal, both signals being inputted through the first input terminal;
a first sampling capacitor operatively coupled between the first input terminal of the comparator and an input terminal of the ramp signal;
a sampling switch operatively coupled between an output terminal of the comparator and the second input terminal of the comparator; and
a second sampling capacitor operatively coupled between a ground terminal and the second input terminal of the comparator,
wherein the sampling switch and the second sampling capacitor sample the reset signal of the pixel signal to set an input common mode voltage to a specific voltage level, and the second sampling capacitor stores the input common mode voltage before the ramp signal start to ramp.
2. The comparison device of claim 1, wherein the comparator samples the reset signal inputted to the first input terminal and sets an input common mode voltage to a specific voltage level.
3. The comparison device of claim 1, wherein the first sampling capacitor stores an offset between a reference voltage of the ramp signal and a reset signal.
4. The comparison device of claim 1, wherein the first input terminal includes a positive input terminal, and the second input terminal includes a negative input terminal.
5. A complementary metal-oxide-semiconductor (CMOS) image sensor comprising:
a pixel array including a plurality of unit pixels each suitable for outputting a pixel signal including a reset signal and an image data signal corresponding to incident light;
a row decoder suitable for selecting a pixel in the pixel array according to row lines;
a ramp signal generation device suitable for generating a ramp signal;
a comparison unit suitable for sampling the reset signal from the pixel array to set an input common mode voltage, store an offset between a reference voltage of the ramp signal from the ramp signal generation device and the reset signal, and determine the reset signal and the image data signal based on the sampled input common mode voltage according to the ramp signal;
a counting unit suitable for counting a clock from the control unit according to each output signal from the comparison unit;
a memory unit suitable for storing counting information from the counting unit;
a control unit suitable for controlling operations of the row decoder, the ramp signal generation device, the counting unit, and the memory unit; and
a column readout circuit suitable for outputting data of the memory unit under the control of the control unit,
wherein the comparison unit comprises a comparator suitable for comparing the pixel signal inputted through a first input terminal with the ramp signal, and
wherein the comparison unit samples the reset signal outputted from the comparator to set the input common mode voltage, and the comparison unit stores the input common mode voltage after a reset operation of the unit pixels and before the ramp signal start to ramp.
6. The CMOS image sensor of claim 5, wherein the comparison unit further comprises:

a first sampling capacitor operatively coupled between an input terminal of the ramp signal and the first input terminal of the comparator;

a sampling switch operatively coupled between an output terminal of the comparator and a second input terminal of the comparator; and a second sampling capacitor operatively coupled between a ground terminal and the second input terminal of the comparator.

7. The CMOS image sensor of claim 6, wherein the sampling switch and the second sampling capacitor sample the reset signal to set the input common mode voltage, and the second sampling capacitor stores the input common mode voltage.

8. The CMOS image sensor of claim 5, wherein the first input terminal includes a positive input terminal, and the second input terminal includes a negative input terminal.

9. The comparison device of claim 1, wherein the reset signal and the image data signal are determined respectively by a ramp swing of the ramp signal based on the sampled input common mode voltage.

* * * * *